United States Patent
Dent et al.

[11] Patent Number: 5,262,734
[45] Date of Patent: Nov. 16, 1993

[54] AMPLIFICATION SYSTEMS

[75] Inventors: Gary V. Dent, Bracknell; Christopher J. Andrews, Reading, both of England

[73] Assignee: Racal Communications Systems Limited, Bracknell, England

[21] Appl. No.: 905,777

[22] Filed: Jun. 29, 1992

[30] Foreign Application Priority Data

Jul. 6, 1991 [GB] United Kingdom ............... 9114646

[51] Int. Cl.⁵ ............................................. H03F 1/32
[52] U.S. Cl. .................................... 330/52; 330/149
[58] Field of Search ............. 330/52, 149; 332/123, 332/159; 375/60; 455/63

[56] References Cited

U.S. PATENT DOCUMENTS

| | | |
|---|---|---|
| 4,025,855 | 5/1977 | Atkinson . |
| 4,165,493 | 8/1979 | Harrington ............... 330/207 P |
| 4,238,855 | 12/1980 | Zborowski ............... 455/103 |
| 4,422,047 | 12/1983 | Wright ............... 330/51 |
| 4,491,973 | 1/1985 | Idol ............... 455/115 |
| 4,561,111 | 8/1984 | Conner ............... 455/63 |

FOREIGN PATENT DOCUMENTS

| | | |
|---|---|---|
| 040127 | 11/1981 | European Pat. Off. . |
| 149319 | 7/1985 | European Pat. Off. . |
| 190073 | 8/1986 | European Pat. Off. . |
| 407919 | 1/1991 | European Pat. Off. . |
| 633524 | 1/1988 | Japan ............... 330/149 |
| 1381597 | 1/1975 | United Kingdom . |
| 1419519 | 12/1975 | United Kingdom . |
| 1565153 | 4/1980 | United Kingdom . |
| 2153173A | 8/1985 | United Kingdom . |
| 2204202 | 11/1988 | United Kingdom . |

OTHER PUBLICATIONS

International Technology Disclosures ITD 79016, vol. 8, No. 7, Jul. 25, 1990.
COMSAT Technical Review, vol. 15, No. 2, Part A, 1985, pp. 309 to 341, Washington US "Linearised transponder technology for satellite communications, Part II: System simulation and performance assessment:" Y. S. Lee et al.

Primary Examiner—James B. Mullins
Attorney, Agent, or Firm—Leydig, Voit & Mayer

[57] ABSTRACT

An amplification system for amplifying an input signal at radio frequency comprises a linear power amplifier and a drive unit. In a test mode, the drive unit feeds two signal tones simultaneously to the amplifier input and a processing circuit analyse the output of the amplifier to identify distorting IMPs. A predistortion circuit operates in an amplification mode to apply a predistortion to a digital representation of the input signal to compensate for the effect of the distorting IMPs generated in the amplifier.

7 Claims, 3 Drawing Sheets

AMPLIFICATION SYSTEMS

FIELD OF THE INVENTION

This invention relates to amplification systems and particularly, though not exclusively, to amplification systems that form the final power amplifier stage of radio frequency transmitters.

BACKGROUND OF THE INVENTION

When a transmitter is required to transmit a signal which contains components at several distinct frequencies, nonlinearities in the final power amplifier give rise to intermodulation products (IMPs) at the output of the amplifier at frequencies other than those present in the input signal. The IMPs therefore distort the output and hence cause interference in adjacent channels. This effect gives rise to a significant technical problem where the frequency of the input signal to the final power amplifier stage represents information, for example if the input signal is the output of a parallel tone modem, or where the transmitter is being used to transmit several different signals at the same carrier frequency, as in an independent sideband mode of operation. For such Purposes, a typical specification requires that any IMPs should be reduced by at least −35dB relative to the wanted signals. Although it is possible to achieve this with amplifiers using valves, it has been difficult and impractical to produce IMPs reduced by more than −30dB with solid state class B linear amplifiers operating at radio frequencies.

Typically, attempts have been made to reduce distortion in such amplifiers by the use of inverted feedback techniques and a number of amplifier stages, in order to compensate for the reduction in gain produced by the negative feedback. Improvements may also be obtained by carefully selecting the biasing conditions of the transistors used. Such design considerations are well discussed in the literature. However, such techniques have been found ineffective in meeting the high specifications required.

Also, it has been proposed to use predistortion circuits interposed between a signal source and a transmission line so that the distortion imposed on the signal as it is transmitted along the line can be compensated allowing the signal to be correctly received.

U.K. Patent Specification No. 2204202 discloses a method of analysing the distorting IMPs produced in a linear Power amplifier and the use of a bank of predistortion circuits to compensate for such distortion. However, the techniques disclosed in this specification have practical limitations in that the analysis and predistortion are carried out as separate procedures, possibly in respect of different amplifiers having the same nominal specification. Furthermore, each predistortion circuit consists of a network of electrical components and is therefore applicable to a broad band of, as distinct from discrete, frequencies.

It is an object of the invention to provide an amplification system which at least alleviates the aforementioned problem.

SUMMARY OF THE INVENTION

According to the invention there is provided an amplification system for amplifying an input signal at a radio frequency, comprising a linear power amplifier and drive means connected to the input and the output of the amplifier, wherein the drive means is arranged to operate in a test mode followed by an amplification mode and comprises means, operable in the test mode, for generating a test signal to be fed to the amplifier input and giving rise to distorting intermodulation products (IMPs) in the amplifier output signal, means to process the amplifier output signal to identify the distorting IMPs, and a predistortion circuit, operable in the amplification mode, for distorting a digital representation of said input signal in response to the distorting IMPs identified by the processing means, the distortion applied by the predistortion circuit being equal and opposite to the distortion produced by the amplifier, at said radio frequency, so that the output signal produced at the output of the amplifier is substantially undistorted.

In a preferred embodiment of the invention, the test signal comprises two signal tones which are fed simultaneously to the amplifier input, the frequencies of the two signal tones being such as to give rise to said distorting intermodulation products (IMPS) in the amplifier output signal. Alternatively, a different number of signal tones could be used.

The predistortion circuit preferably operates at an intermediate frequency.

In an embodiment of the invention, the means for generating the two signal tones comprises means for generating two test frequencies and means for mixing the two test frequencies with a radio frequency local oscillator signal whereby to generate the two signal tones to be fed to the amplifier input.

The two test frequencies may differ in frequency by 1 or 2 kHz.

The processing means may be arranged to determine amplitude and phase distortions produced by the distorting IMPs relative to the amplitude and phase of the vector sum of the two signal tones.

The drive means may include analogue-to-digital conversion means for converting the input signal and the amplifier output signal to respective digital samples, and wherein the processing means and the predistortion circuit operate on the respective digital samples using digital signal processing techniques.

The predistortion circuit may be arranged to modify the amplitude and/or phase of each digital sample in dependence on the amplitude and/or phase of the sample.

The drive means may be arranged to operate in the test mode and the amplification mode alternately.

DESCRIPTION OF THE DRAWINGS

An amplification system according to the invention is now described, by way of example only, with reference to the accompanying drawings in which.

DESCRIPTION OF PREFERRED EMBODIMENTS

Figure 1:
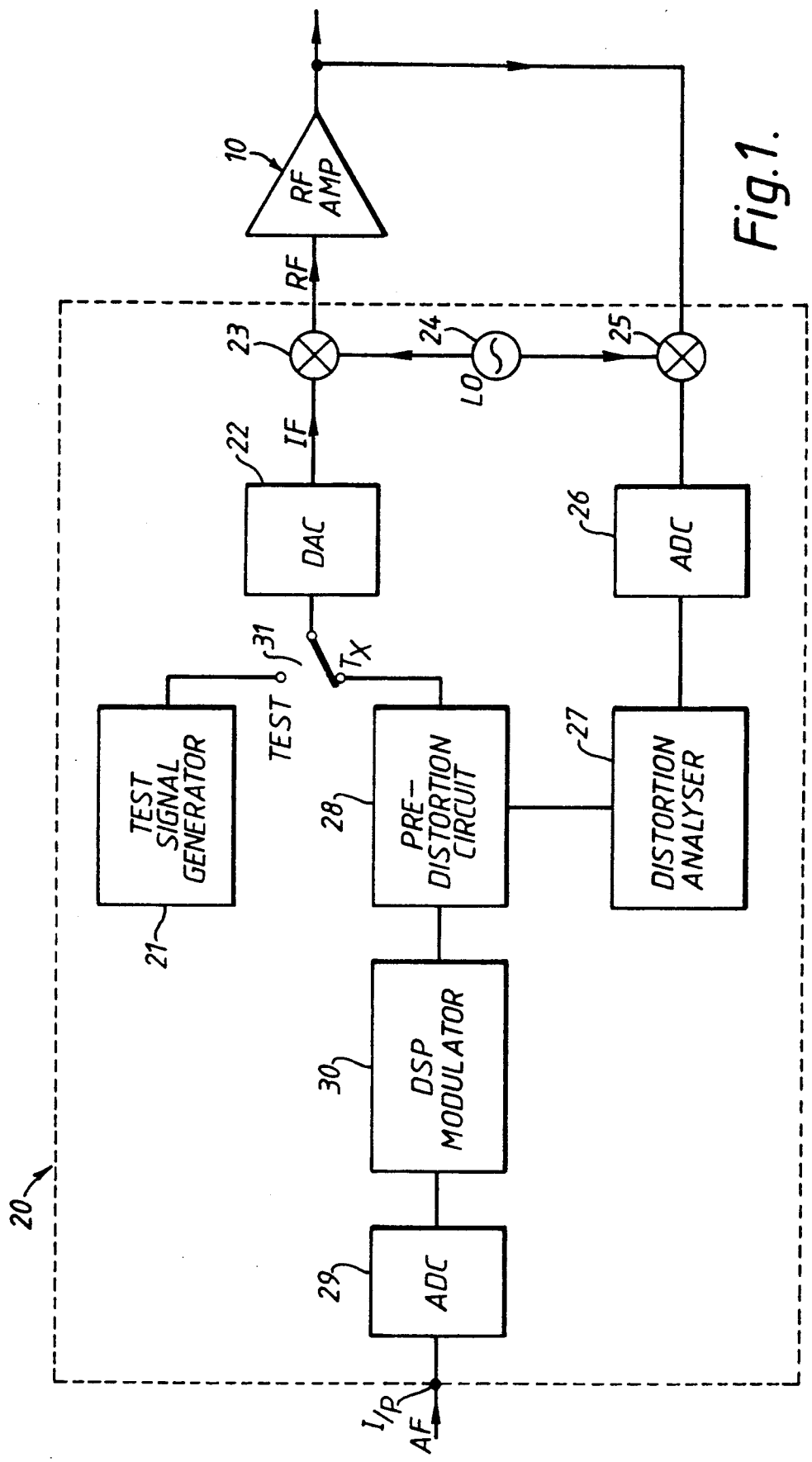
FIG. 1 is a block diagram showing the amplification system.

The amplification system shown in FIG. 1 is used as the final power amplifier stage of a high frequency (HF) radio transmitter. The input to the amplifier stage may, for example, be a voice signal or the output of a parallel tone modem.

Referring to FIG. 1, the amplification system comprises a linear power amplifier 10 and a drive unit 20 which is connected to the input and the output of the amplifier.

The drive unit 20 has two modes of operation—a test mode and an amplification mode.

In the test mode, the drive unit generates two signal tones and these are supplied simultaneously to the amplifier input at the required RF transmission frequency. In this embodiment, the transmission frequency is in the HF range (e.g. 1.6 MHz to 30 MHz).

The two signal tones generated in the test mode are separated in frequency by only a few kilohertz (typically 1 or 2 kHz) giving rise to distorting intermodulation Products (IMPs) at the amplifier output, caused by non-linearly in the amplifier response.

The signal tones are generated by means of a frequency generator 21 which produces two test frequencies that are mixed to the required RF transmission frequency. The test frequencies produced by generator 21 might typically be 1.401 MHz and 1.399 MHz. However, different frequencies than these could be used.

In this embodiment of the invention, the two test frequencies are produced digitally and they are converted to an intermediate frequency (IF) of 1.4 MHz by a digital-to-analogue conversion circuit 22. The IF signal is then mixed to the required RF transmission frequency by means of a mixing circuit 23 connected to a local oscillator 24.

The amplified output from the linear power amplifier 10 (which contains distorting IMPs) is routed back to the drive unit and is mixed down to an intermediate frequency using a further mixing circuit 25 connected to the local oscillator 24. The IF signal is then converted to digital samples in an analogue-to-digital conversion circuit 26 and supplied to a digital processing circuit 27 which is Programmed to analyse any amplitude and phase distortions of the supplied signals caused by distorting IMPs generated in the amplifier 10. To that end, the digital Processing circuit is programmed to perform a Fourier transform on the digital samples using an FFT algorithm, and then to analyse the results. It will be appreciated, that these functions can be readily carried out by suitable programs which need not be described in detail herein except for the functions which they perform, which are set out more fully below.

Figure 2:
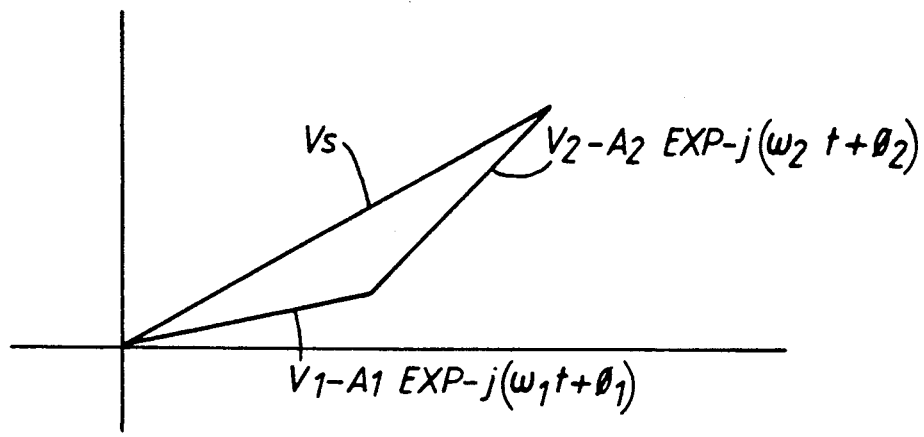
FIG. 2 is a vector diagram for illustrating the input signal to an amplifier to be analysed in the test mode.

In order to analyse the amplitude and phase information generated by the FFT, it is required to determine the phase and amplitude distortions as a function of the amplitude of the two signal tones and this is illustrated in FIGS. 3a to 3d for several types of distortion. The processing circuit 27 is programmed to analyse the frequency spectrum generated by the FFT, to identify the two signal tones in the spectrum, and then compute the vector sum of the two signal tones, as shown in FIG. 2, where the first tone is identified by the vector $V_1$ which can be expressed as $A_1 e - j(\omega_1 t + \phi_1)$ the second tone is shown by the vector $V_2$ as $A_2 e - j(\omega_2 t + \phi_2)$. In this particular example $\omega_1 = 1.401$ MHz and $\omega_2 = 1.399$ MHz, $\phi_1$ and $\phi_2$ are the relative phases of the two signal tones and the maximum amplitudes of the signals, $A_1$ and $A_2$ are ideally equal. The vector sum of the two tones $V_1$ and $V_2$ is shown by the vector $V_s$. It will be appreciated that the vector $V_s$ rotates in time and that its amplitude will change as a function of time since the frequencies of its two components are different. The phase of the vector sum $V_s$ of the two signal tones is used as a reference phase throughout the following analysis and the average frequency of the two signal tones, that is 1.400 MHz in the present example, is used as a reference frequency. Therefore, relative to this reference, the two signal tones have frequencies of plus and minus 1kHz respectively, resulting in their vector sum $V_s$ having a constant phase.

The processing circuit identifies from the output of the FFT those sample frequencies at which there is a large signal, that is one having an amplitude greater than a Predetermined threshold value. This threshold value may be determined by reference to the amplitude of the two signal tones and the required level to which all IMPs are to be reduced, as determined by the design specification for the amplifier. In this example, only signals which are at IMP frequencies (e.g. ±3kHz, ±5kHz etc.) are used in the calculations that follow. Any other large signals are monitored just as a check on the test. There should be no large signals except the IMPs and their harmonics. The phase of these IMPs relative to the reference phase is then computed. From this information it is possible to calculate the vector sum of the IMPs for a number of points (typically 200 during a 1 millisecond period) which corresponds to 1kHz and would therefore cover a complete cycle of the vector sum of the two signal tones. The component of the vector sum of the IMPs which is in phase with the vector sum of the two signal tones is then computed and this component represents the amplitude distortion. The component of the vector sum of the IMPs at 90° to the vector sum of the two signal tones represents the phase distortion.

Figure 3A:
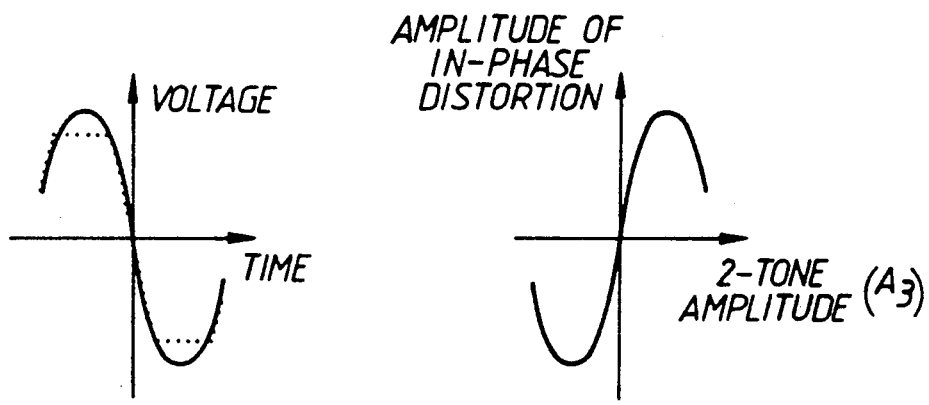
FIGS. 3a to 3d show, on the left hand side, amplitude versus time plots of distorted output signals from an amplifier fed with two signal tones as in the system of FIG. 1, and on the right hand side, corresponding plots of the amplitude of in-phase and quadrature distortions relative to the amplitude of the two signal tones.
Figure 3B:
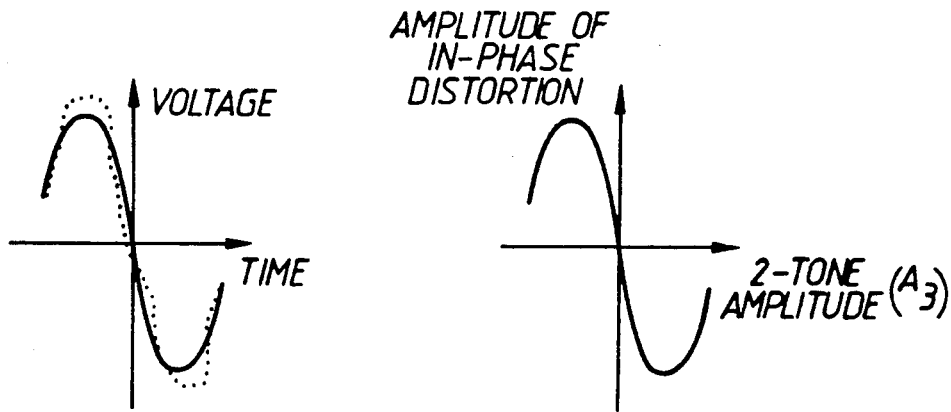

The right hand side of FIGS. 3a and 3b shows two basic forms of amplitude distortion plotted as a function of $A_3$—the amplitude of the two signal tones, with the effect they have on the actual waveform shown on the left hand side where voltage is plotted against time, the solid line waveforms showing the ideal, undistorted waveform, and the dotted line showing the distorted waveform.

As shown in FIG. 3a, there is positive amplitude distortion at low levels of $A_3$ and negative amplitude distortion at high levels. This is caused by the gain of the amplifier 10 decreasing with amplitude as can be seen by a comparison of the waveforms on the left hand side of FIG. 3a.

The amplitude distortion plot shown in FIG. 3b shows the result of gain decreasing with amplitude. This type of distortion is known as cross-over distortion.

Figure 3C:
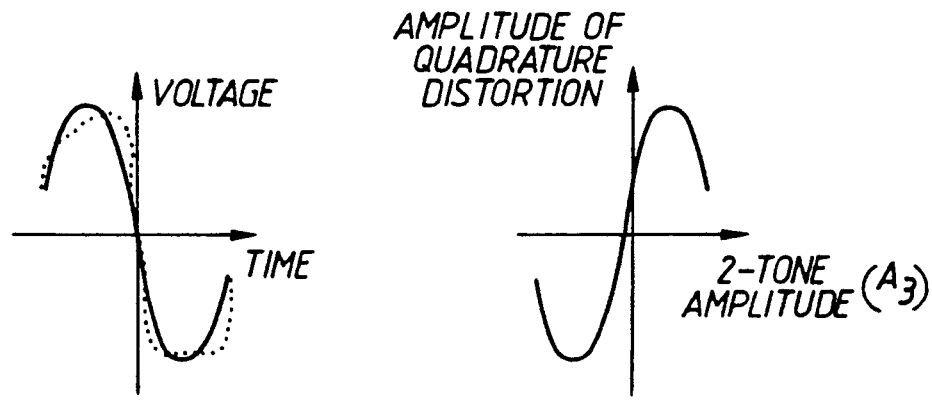
Figure 3D:
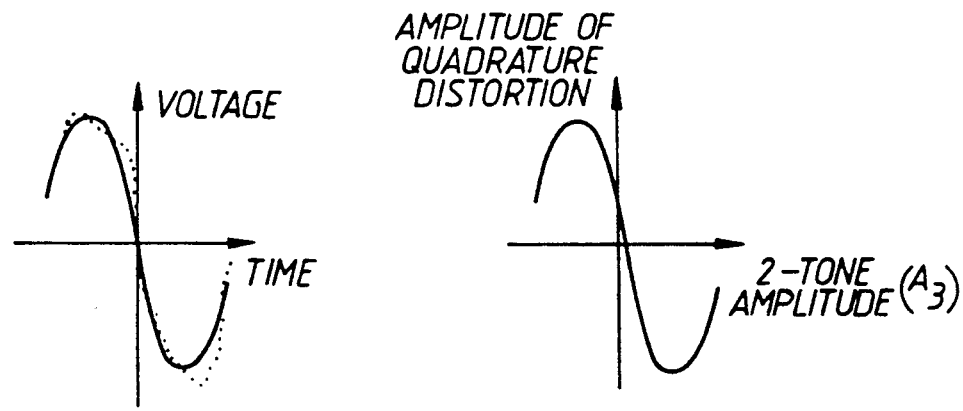

Similar plots for phase distortion are shown in FIGS. 3c and 3d. In FIG. 3c, the distortion is due to the delay through the amplifier increasing with the amplitude of the signal The reverse situation is illustrated in FIG. 3d.

With a knowledge of the amplitude and phase distortions it is possible to calculate the transfer function for the linear power amplifier; that is to say, the function that relates the magnitude of the amplifier input voltage $V_{IA}$ to the magnitude of the amplifier output voltage $V_{OA}$. If there are no distorting IMPs present, then $V_{OA}$ would be related linearly to $V_{IA}$, as illustrated by the straight line relationship of curve A in FIG. 4. This relationship can be expressed as $$V_{OA} = a\, V_{IA} \qquad \text{Equation 1}$$

where a is the amplification factor of the amplifier.

Figure 4:
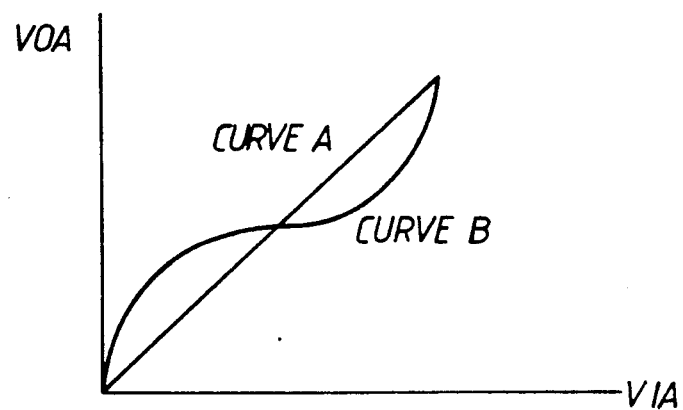
FIG. 4 shows transfer functions for a linear power amplifier in the case when distorting IMPs are present and absent.

However, in general, distorting IMPs will be present, giving rise to a departure from linearity of the transfer function, as illustrated by curve B in FIG. 4. In this case, the transfer function can be represented by an infinite series of the form:

$$V_{OA} = b_1\, V_{IA} + b_2\, V_{IA}^2 + b_3\, V_{IA}^3 + \qquad \text{Equation 2}$$

where the coefficients $b_1$, $b_2$, $b_3$ etc are constants.

After a predetermined time interval, sufficient to enable the digital processing circuit 27 to complete its analysis of the test signals, the drive unit switches to the amplification mode, enabling a predistortion circuit 28 to subject input signals to an appropriate predistortion such that the output of the amplifier is an amplified, but otherwise substantially identical, version of the input thereto, whereby to simulate a linear transfer function.

The input signals that require amplification (these could be voice signals or modem signals, for example) are received at an input I/P of the drive unit and converted to digital samples in an analogue-to-digital conversion circuit 29. The digital samples are then passed to a digital modulating circuit 30 and are modulated to the afore mentioned IF frequency before being supplied to the Predistortion circuit 28. In the test mode, a switch 31 connects the frequency generator 21 to the digital-to-analogue conversion circuit 22, whereas in the amplification mode the switch connects the predistortion circuit 28 to the conversion circuit 22.

The predistortion circuit 28 subjects the input signals to a required predistortion using digital signal processing (DSP), by modifying each successive digital sample by an amount that depends on its magnitude and/or phase and the measured amplitude and/or phase distortion. The modification factor that needs to be applied will be determined by the transfer function for the amplifier and this will change with RF transmission frequency. The required modification factors may be stored as a function of signal magnitude and/or phase in a Random Access Memory (RAM) in the predistortion circuit, the RAM being used, in effect, as a "look-up" table.

If there is a requirement to modify amplitude only, the look-up table would contain real data. However, if there is a requirement to modify both the amplitude and phase (in dependence on the amplitude and/or phase of the digital input signal), the look-up table would contain complex data.

Alternatively, the required modification factors could be calculated directly from a series of the form of Equation 2 using the correct coefficients $b_1$, $b_2$, $b_3$ etc for the relevant transfer function. These coefficients may be complex.

The drive unit 10 operates in real time, and this has the advantage that the analysis of distorting IMPs (carried out in the test mode) and the application of the required Predistortion (carried out in the amplification mode) can be performed on the same linear amplifier with the same load. The described arrangement offers a significant advantage over prior arrangements wherein the analysis and Predistortion are carried out as separate procedures, Possibly on different amplifiers of the same nominal specification and might, therefore, be prone to inaccuracies.

Furthermore, the predistortion circuit of this invention employs digital signal processing techniques enabling the required predistortion to be calculated and applied in respect of the actual RF transmission frequency (as distinct from a band of frequencies).

With the described arrangement, the drive circuit may switch alternately between the test mode and the amplification mode (during every tuning sequence of the RF transmitter for example) so that the predistortion can be adjusted, as appropriate, in response to changes in the RF transmission frequency.

We claim:

1. A radio frequency amplification system, comprising a linear power amplifier and drive means connected to the input and to the output of the amplifier, the drive means including means to generate a digital representation of an input signal supplied to the amplification system, wherein the drive means is arranged to operate in a test mode followed by an amplification mode and comprises means, operable in the test mode, for generating two test frequencies, means for mixing the two test frequencies with a radio frequency local oscillator signal to produce two signal tones which are fed to the amplifier input and give rise to distorting intermodulation products (IMPs) in the amplifier output signal, means to process the amplifier output signal to identify the distorting IMPs, and a predistortion circuit, operable in the amplification mode, for distorting said digital representation of the input signal in response to the distorting IMPs identified by the processing means, the distortion applied by the predistortion circuit being equal and opposite to the distortion produced by the amplifier, so that the radio frequency output signal outputted by the amplifier in the amplification mode is substantially undistorted.

2. An amplification system as claimed in claim 1, wherein the predistortion circuit operates at an intermediate frequency.

3. An amplification system as claimed in claim 1, wherein the two test frequencies differ in frequency by a few kHz.

4. An amplification system as claimed in claim 1, wherein the processing means is arranged to determine amplitude and phase distortions produced by the distorting IMPs relative to the amplitude and phase of the vector sum of the two signal tones.

5. An amplification system as claimed in claim 1, wherein the drive means includes analogue-to-digital conversion means for converting the input signal and the amplifier output signal to respective digital samples, and wherein the processing means and the predistortion circuit operate on the respective digital samples using digital signal processing techniques.

6. An amplification system as claimed in claim 5, wherein the predistortion circuit is arranged to modify the amplitude and/or phase of each digital sample in dependence on the amplitude and/or phase of the sample.

7. An amplification system as claimed in claim 1, wherein the drive means is arranged to operate in the test mode and the amplification mode alternately.

* * * * *